United States Patent [19]

Little et al.

[11] Patent Number: 5,698,984
[45] Date of Patent: Dec. 16, 1997

[54] ADAPTIVE DIGITAL FILTER FOR IMPROVED MEASUREMENT ACCURACY IN AN ELECTRONIC INSTRUMENT

[75] Inventors: Erik R. Little; Steven D. Swift, both of Seattle; Greg S. Gibson, Bothell, all of Wash.

[73] Assignee: Fluke Corporation, Everett, Wash.

[21] Appl. No.: 594,065

[22] Filed: Jan. 30, 1996

[51] Int. Cl.$^6$ .................................................. G01R 35/00
[52] U.S. Cl. .......................... 324/601; 324/74; 324/76.15; 364/571.01
[58] Field of Search ............................ 324/601, 74, 130, 324/76.12, 76.13, 76.15, 76.24, 76.28, 76.38; 364/571.01, 571.07, 572, 487

[56] References Cited

U.S. PATENT DOCUMENTS

| | | | |
|---|---|---|---|
| 5,463,893 | 11/1995 | Pla et al. | 364/572 X |
| 5,557,267 | 9/1996 | Poduje et al. | 324/601 X |
| 5,594,612 | 1/1997 | Henrion | 324/620 X |

*Primary Examiner*—Glenn W. Brown
*Attorney, Agent, or Firm*—Douglas J. Barker

[57] ABSTRACT

An adaptive digital filter is provided to obtain improved measurement accuracy in an electronic instrument which has a front-end circuit for coupling to an input signal to be measured. An analog to digital converter converts the input signal received through the front-end circuit into a stream of measurement values during the measurement phase. The stream of measurement values are then provided to the adaptive digital filter which mathematically operates on them to remove the frequency response effects of the front-end circuit in a process of convolution in the time domain using a set of digital filter values obtained during the calibration phase. Because the frequency response requirements of the front-end circuit have been eased with the addition of the adaptive digital filter, a simpler front-end circuit with fewer components and with no need for manual adjustment may be employed in electronic instruments.

19 Claims, 6 Drawing Sheets

ADAPTIVE DIGITAL FILTER FOR IMPROVED MEASUREMENT ACCURACY IN AN ELECTRONIC INSTRUMENT

BACKGROUND OF THE INVENTION

This invention relates generally to adaptive digital filters and in particular to an adaptive digital filter for improving the measurement accuracy of an electronic instrument.

A variety of electronic instruments exist for measuring electrical signals. In a typical electronic instrument, the signal is coupled to analog "front-end" or input circuit which may consist of amplifiers, attenuators, filters, voltage protection devices, and other circuits for operating on the input signal ahead of an analog to digital converter (ADC). A digital multimeter is an example of a commonly available electronic instrument which measures d.c. (direct current) and a.c. (alternating current) voltage, d.c. resistance, along with a.c. and d.c. current. The front-end circuit is needed to configure the digital multimeter for each of these measurement modes and to provide a modified signal in a form that may be measured by the ADC circuit.

The front-end circuit is commonly used for voltage level shifting, such as to amplify low voltage level signals up to a level acceptable for measurement by the ADC and to attenuate high voltage level signals down to a level acceptable for measurement by the ADC. The front-end circuit may also be used to provide protection for the electronic instrument from accidental coupling to high voltage levels that may cause damage, to filter the signal to remove unwanted frequency components outside of the desired measurement range which may adversely affect accuracy, or to switch the signal between the various amplifiers, attenuators, and filters to configure the electronic instrument for a variety of measurement modes.

Measurement accuracy is often an important parameter in electronic instruments. Electronic instruments typically must maintain a specified accuracy level while measuring a.c. signals over a specified frequency range. Ideally, the front-end circuit and the ADC in the electronic instrument respond equally to any signal within the specified frequency range. However, actual front-end circuits and ADC's do not have such an ideal frequency response and frequency compensation is required in order to obtain acceptable accuracy.

Prior art electronic instruments have employed various methods to maintain measurement accuracy over a selected range of frequencies. Analog compensation techniques involve either design "overkill" in which the production variances are substantially less than the design tolerance level or as manually adjusting circuit parameters to change the shape of the frequency response of the front-end circuit to match a desired frequency response and accuracy level. While such analog compensation techniques are effective, their implementation requires additional component costs and manufacturing time, thus adding to the manufacturing cost of the product as well as to the maintenance and calibration costs over the life of the product.

Another method of obtaining a desired accuracy level in an electronic instrument which allows a simplified front-end circuit is to measure the frequency response of the front-end circuit using a calibration signal of known amplitude over a range of frequencies and recording the measured results in a look-up table. In this way, the measured results of a signal may be normalized against the values in the look-up table to obtain normalized measurements with enhanced accuracy. This technique is effective as long as the frequency of the signal being measured is known so that the correct value in the look-up table is selected to normalize the measurement.

Therefore, it would be desirable to obtain improved measurement accuracy in an electronic instrument for a.c. signals over a desired measurement frequency range with a simplified front-end circuit that requires no adjustment of its frequency response. It would be further desirable to provide a method of frequency compensation that requires no knowledge of the frequency of the input signal to be measured within the desired measurement frequency range.

SUMMARY OF THE INVENTION

In accordance with the present invention, an adaptive digital filter is provided to obtain improved measurement accuracy in an electronic instrument. A front-end circuit in the electronic instrument provides for all the necessary attenuation, amplification, filtering, protection, and switching functions that are necessary to couple the input signal to an ADC for measurement. The ADC produces measurement values in the form of digital data which may then be stored and mathematically manipulated. The ADC must have a sample rate that is at least twice that of the highest frequency of the desired frequency range to allow adequate time resolution to calculate the digital filter values of the adaptive digital filter. Higher sample rates provide greater time resolution of the input signal and proportionately greater accuracy of the measured signal because the frequency normalization by an adaptive digital filter is more accurate.

During a calibration phase, a calibration signal source of known voltage and frequency characteristics is provided when normalization of the front-end circuit is to be performed. The calibration signal is measured and digital filter values are optimized to remove the frequency response effects of the front-end circuit. During a measurement phase, an input signal to be measured is coupled to the input of the front-end circuit and a stream of measurement values generated by the ADC are operated on by the adaptive digital filter using time domain convolution to obtain a stream of normalized measurement values.

The digital filter values are calculated by coupling the calibration signal source to the input of the front-end circuit, measuring the calibration signal source to obtain a set of calibration measurement values responsive to the calibration signal, and comparing the set of calibration measurement values against an ideal set of calibration measurement values to obtain an error vector.

Using one of a variety of adaptive digital filter techniques including finite impulse response (FIR) filters, the measurement values are then operated upon by the adaptive digital filter using a process of convolution to remove the frequency distortion effects of the front-end circuit. The frequency domain equivalent of this convolution process is to multiply the measurement values by the inverse of the frequency response of the front-end circuit to normalize its effects. Because transforming measurement values from the time domain into the frequency domain for the normalization and then back into the time domain is prohibitively complex and requires intense computation, it is desirable to implement the digital filter that operates on the measurement values in time domain.

Using convolution, the adaptive digital filter may perform the equivalent normalization completely in the time domain. The adaptive digital filter values necessary to perform the convolution are calculated to minimize the differences between an estimate signal and the desired signal according to an adaptive algorithm. For the FIR filter, the digital filter values may be calculated according to an adaptive algorithm known and applied to FIR filters. In the preferred embodiment, the least means squares (LMS) adaptive algorithm was chosen for its simplicity and ease of application. Other adaptive algorithms known in the art may readily be substituted. Once calculated, the digital filter values are then used by the adaptive digital filter to operate on the measurement values as they are collected in the stream of measurement values which arrive at a known sample rate. The stream of measurement values is then convolved with itself within the adaptive digital filter according to the digital filter values to form a new stream of normalized measurement values which have the frequency distortion effects of the front-end circuit minimized.

The measurement values are provided to the adaptive digital filter which mathematically operates on each of the measurement values to remove the frequency response effects of the front-end circuit using a set of digital filter values. Because the measurement values are operated on according to the set of digital filter values in the adaptive digital filter which are calculated from the calibration measurement values, the frequency of the input signal within the desired frequency range does not have to be determined. The adaptive digital filter operates on the measurement values which arrive at the known sample rate. Because the frequency response requirements of the front-end circuit have been eased with the addition of the adaptive digital filter which compensates for the variations, a simpler front-end circuit with fewer components may be employed. The process of manually adjusting the frequency response of the front-end circuit is eliminated because the adaptive digital filter handles the variations of any particular front-end circuit.

One object of the present invention is to provide a method of obtaining enhanced measurement accuracy in an electronic instrument using an adaptive digital filter.

Another object of the present invention is to provide a method of obtaining enhanced measurement accuracy in an electronic instrument using an adaptive digital filter operating in the time domain to remove the frequency response effects of the front-end circuit.

Another object of the present invention is to provide a method of obtaining a simplified front-end circuit requiring no adjustment of its frequency response in an electronic instrument using an adaptive digital filter to remove the frequency response effects of the front-end circuit.

An additional object of the present invention is to provide a method of obtaining a simplified front-end circuit requiring no adjustment of its frequency response in an electronic instrument using an FIR filter operating in the domain to remove the frequency response effects of the front-end circuit.

Other features, attainments, and advantages will become apparent to those skilled in the art upon a reading of the following description when taken in conjunction with the accompanying drawings.

DETAILED DESCRIPTION OF THE INVENTION

Figure 1:
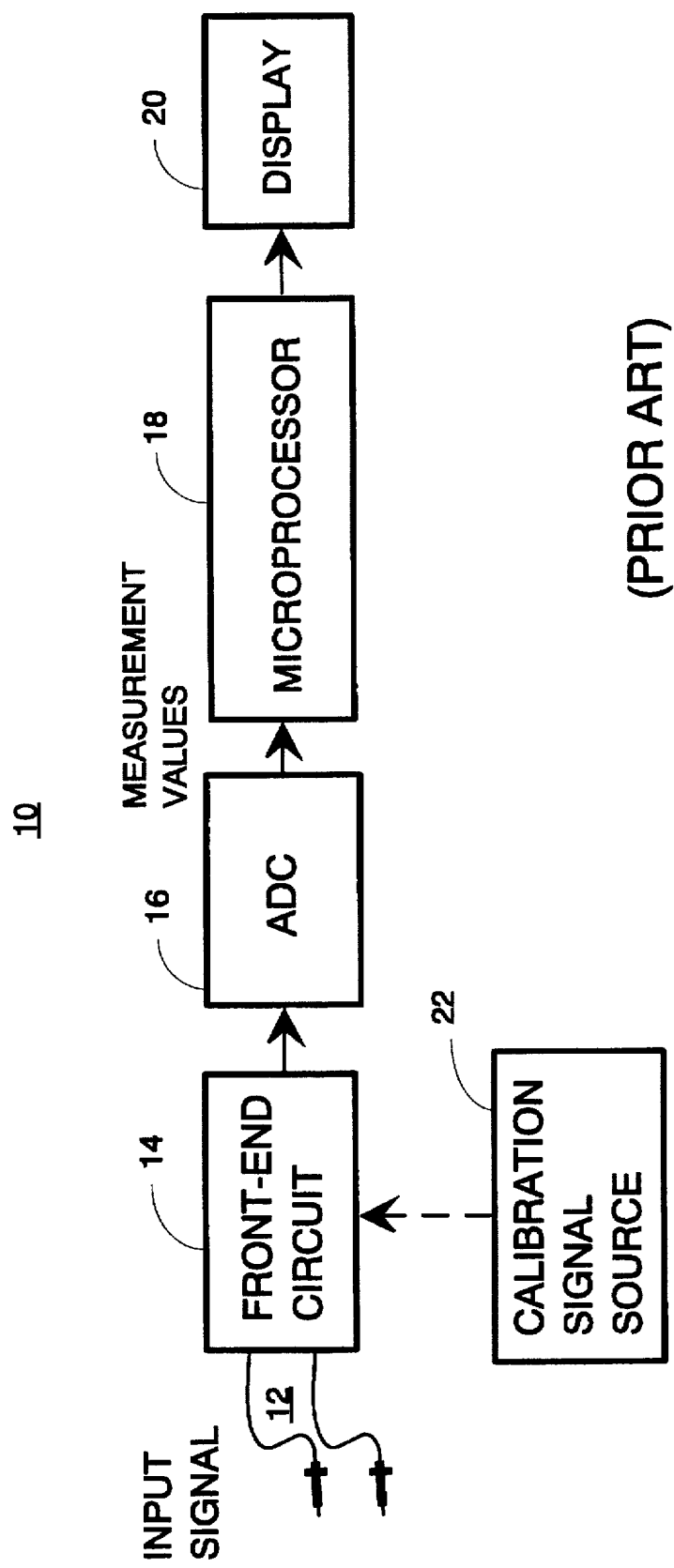
FIG. 1 is a simplified block diagram of an electronic instrument employing a front-end circuit with frequency compensation according to the prior art.

In FIG. 1, there is shown a simplified block diagram of an electronic instrument 10 according to the prior art. The electronic instrument 10 may comprise any of a variety of electronic test and measurement instruments whose basic function is to measure electrical signals of various frequencies, typically in a frequency range below one megahertz. Digital multimeters, data acquisition equipment, and digital signal analyzers are examples of such measurement instruments. An input signal may be any of a variety of electrical signals, including voltage and current levels, along with the output signals from various types of sensors.

A pair of test leads 12 couple the input signal to the electronic instrument 10. A front-end circuit 14 is coupled to the test leads 12 to receive the input signal and convert it to a level acceptable for measurement. The front-end circuit 14 as applied may, for example, amplify low voltage level signals up to a level acceptable for measurement by the ADC, and attenuate high voltage level signals down to a level acceptable for measurement by the ADC. The front-end circuit 14 may also provide protection for the electronic instrument 10 from an accidental coupling to high voltage levels that may cause damage, filter the input signal to remove unwanted frequency components outside of the desired measurement range which may adversely affect measurement accuracy, or switch the input signal between the various amplifiers, attenuators, and filters to configure the electronic instrument 10 for a variety of measurement modes.

An analog to digital converter (ADC) 16 is coupled to the front-end circuit 14 to receive the input signal and convert it to a stream of measurement values in the form of digital data. A microprocessor 18 is coupled to the ADC 16 to receive the measurement values for further processing and storage in digital memory. A display 20 is coupled to the microprocessor 18 to visually display the measurement values in a numerical or graphical format suitable for the application of the electronic instrument 10.

In performing the multiple tasks of filtering, switching, amplifying, and attenuating the input signal, the front-end circuit 14 introduces undesired frequency distortion of the input signal measurement because of variations in its frequency response over the desired frequency range of the input signal. The amount of frequency distortion ultimately governs the accuracy of a measurement of the input signal by the electronic instrument 10 and therefore must be corrected for and minimized.

The electronic instrument 10 has two distinct phases of operation including a calibration phase and a measurement phase. During the calibration phase, the calibration signal source 22, either internal or external to the electronic instrument 10 provides a calibration signal of known amplitudes at various frequencies to the input of the front-end circuit 14 and which is substituted in place of the input signal.

Figure 2A:
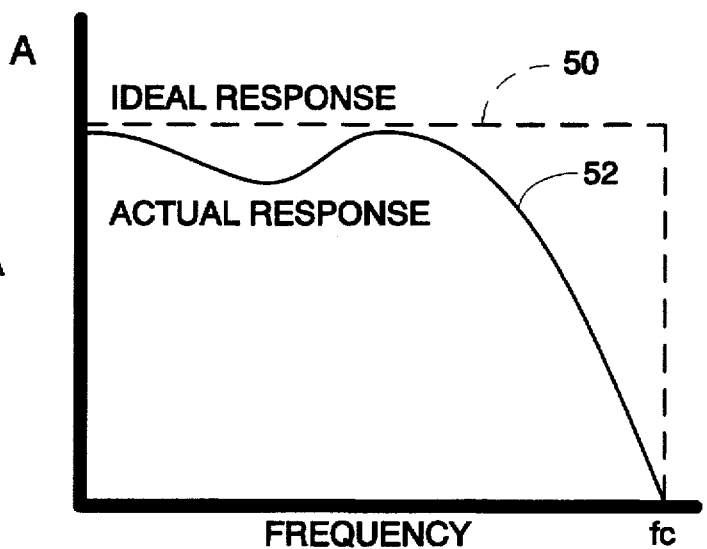
FIG. 2A–C are graphs illustrating an ideal versus an actual frequency response, an adjusted frequency response, and a measured frequency look-up table response of a front-end circuit according to the prior art.
Figure 2B:
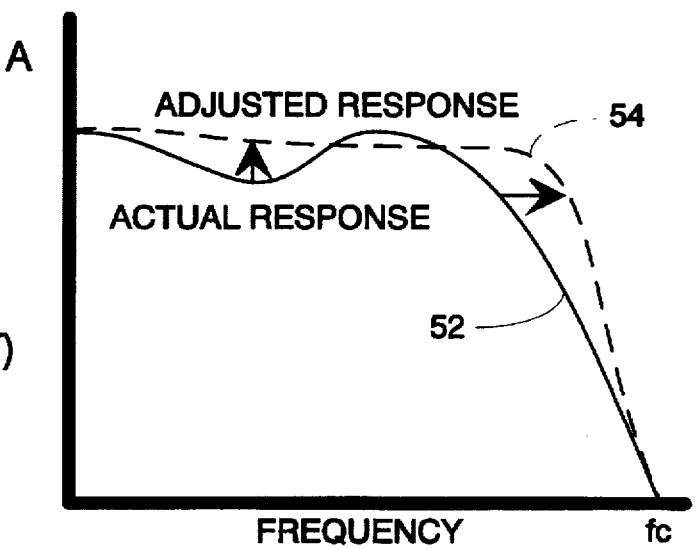
Figure 2C:
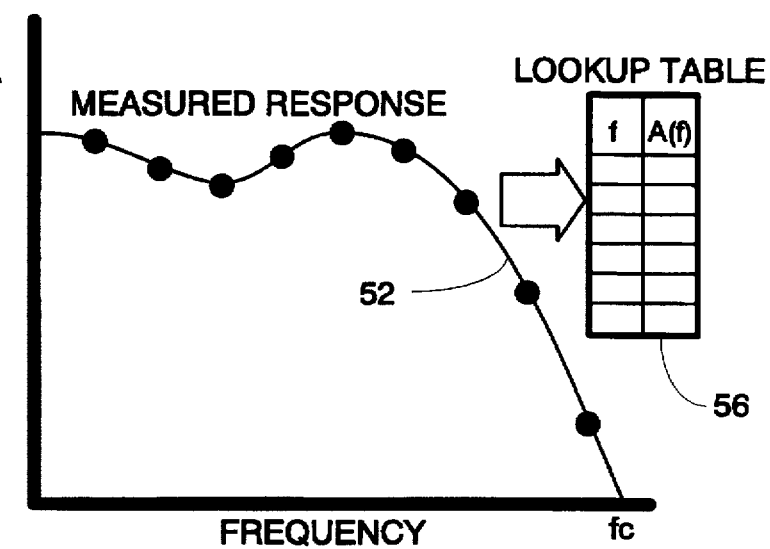

FIG. 2A–C are graphs illustrating an ideal frequency response, an actual frequency response, an adjusted frequency response according to the prior art, and a measured frequency look-up table, all according to the prior art.

Referring now to FIG. 2A, there is shown a graph of amplitude versus frequency, with each plot on the graph collectively known as a frequency response characteristic. Shown are two frequency characteristics, including an ideal frequency response 50 and an actual frequency response 52. Each frequency response characteristic is compiled by supplying a calibration signal of known amplitude over the desired frequency range to the input of the front-end circuit 14, calculating the ratio of the measured amplitude to the actual amplitude of the calibration signal over a range of frequencies, and plotting each of the resulting ratios on the graph as a function of amplitude versus frequency. The ideal frequency response 50 is desirable in that the measurement values are returned by the ADC 16 over the frequency range of interest are substantially the same as the actual amplitudes of the calibration signal over the frequency range of interest which extends to fc, the cutoff frequency. Thus, there is substantially no distortion introduced by the front-end circuit 14 having an ideal frequency response 50 for input signals in the frequency range from zero hertz to fc hertz.

An actual frequency response 52 is shown in FIG. 2A as an example of a frequency response that is more typically encountered in the front-end circuit 14. The shape of the actual frequency response 52 is governed by the physics of any reactive components that appear in the signal path within the front-end circuit 14. As shown, the actual frequency response 52 has "ripple" in the pass-band and a high-frequency roll-off that is substantially lower than the cut-off frequency fc. Because the actual frequency response 52 deviates from the ideal frequency response 50, the measurement values produced by the electronic instrument 10 with the actual frequency response 52 will contain inaccuracies that depend on the frequency components of the input signal.

FIG. 2B is a graph illustrating a method of adjusting the front-end circuit 14 (shown in FIG. 1) to obtain enhanced measurement accuracy according to the prior art. The actual frequency response 52 may be readily measured and characterized by coupling the calibration signal source 22 to the input of the front-end circuit 14 in place of the input signal, such as during a calibration phase of the electronic instrument 10. Compensating elements may be designed into the front-end circuit 14 including resistors, capacitors, and inductors, with values chosen to cause the actual frequency response 52 to more closely resemble the ideal frequency response 50. The adjustment process may be entirely manual, employing an operator who monitors the actual frequency response 52 while manually adjusting the compensating elements to obtain an adjusted frequency response. The adjustment process may also be automated to achieve the same result. In each case, the adjustments must be performed for each individual instrument, resulting in higher manufacturing costs and increased complexity. FIG. 2B shows the actual frequency 52 superimposed on an adjusted frequency response 54 which has been adjusted to more closely resemble the ideal frequency response 50 by flattening out the ripple and increasing the roll-off frequency.

FIG. 2C is a graph illustrating a method of obtaining enhanced measurement accuracy by measuring the actual frequency response 52 and storing the measurement values in a look-up table 56. The look-up table 56 may now be referenced in order to normalize measurement values of an input signal and remove the effects of frequency distortion of the front-end circuit 14. This technique is effective as long as the input signal has frequency components within the desired frequency range of the electronic instrument that are known. Each frequency component may be normalized against a corresponding value in the look up table to remove the effects of the actual frequency response 52. The look-up table technique is effective as long as the input signal has frequency components within the desired frequency range of the electronic instrument that are known and relatively few in number, as in the case of a sine wave.

Figure 3:
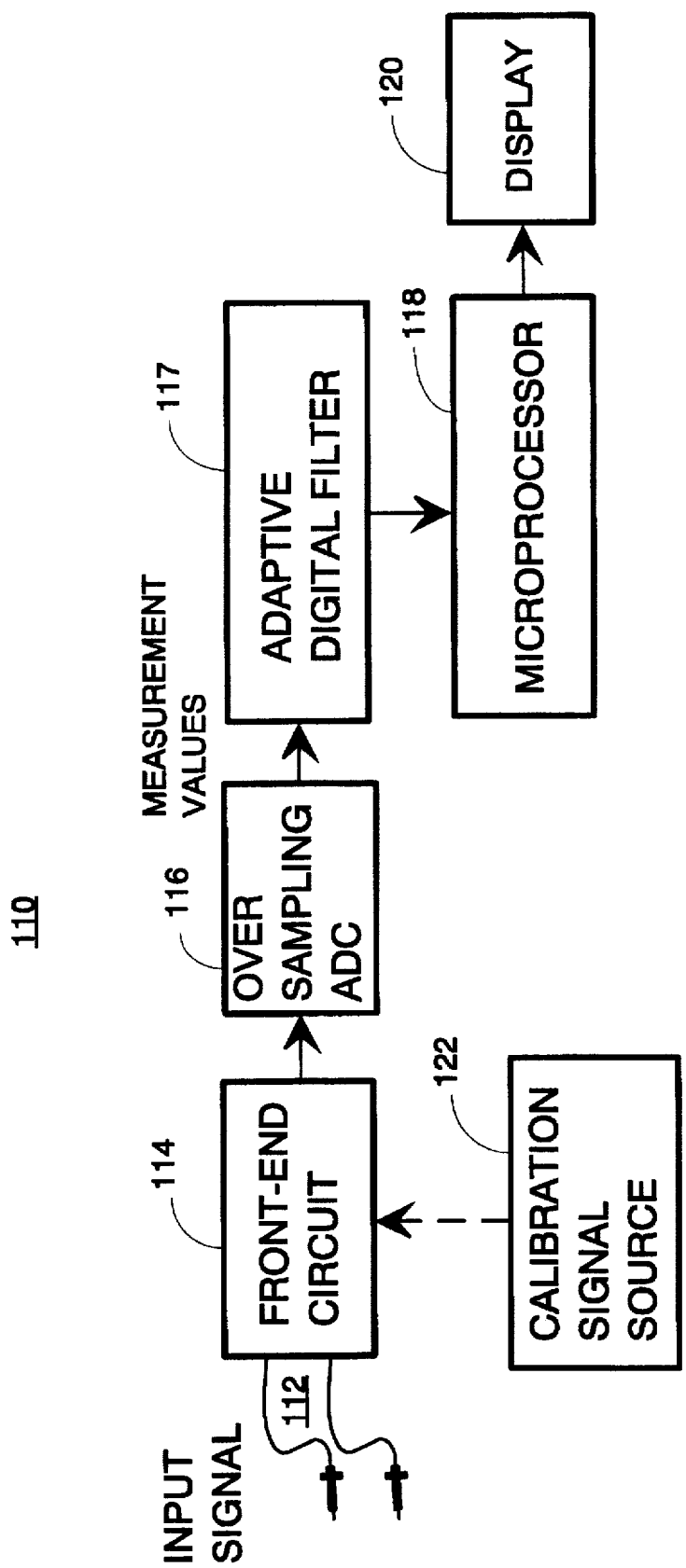
FIG. 3 is a simplified block diagram of an electronic instrument with a front-end circuit with frequency compensation using an adaptive digital filter according the present invention.

FIG. 3 is a simplified block diagram of an electronic instrument 110 employing a method of obtaining enhanced measurement accuracy using an adaptive digital filter according to the present invention. A pair of test leads 112 may be coupled to the input signal. A front-end circuit 114 is coupled to the test leads 112 to receive the input signal and convert the input signal to a level acceptable for measurement. The front-end circuit 114 as applied may amplify low voltage level signals, attenuate high voltage level signals, provide protection for the electronic instrument 110, filter the input signal, or switch the input signal in the same manner as the front-end circuit 14 in the prior art. However, the need for having the actual frequency response 52 that closely resembles the ideal frequency response 50 has been greatly diminished in the front-end circuit 114 as will be explained in more detail below.

An over-sampling analog-to-digital converter (ADC) 116 is coupled to the front-end circuit 114 to receive the input signal and convert it to a stream of measurement values at a sample rate. The minimum sample rate required to reproduce a signal being sampled is normally the Nyquist rate which is twice the maximum frequency component of the input signal. The over-sampling ADC 116 is selected to a sampling rate that is substantially higher than the Nyquist rate. The minimum sampling rate of the over-sampling ADC 116 is governed by the time resolution needed to accomplish adequate accuracy of frequency compensation. An adaptive digital filter 117 is coupled to the over-sampling ADC 116 to receive the measurement values.

The electronic instrument 110 has two distinct phases of operation, including the calibration phase and a measurement phase. During the calibration phase, the calibration signal source 122 is coupled to the input of the front-end circuit 114 in place of the input signal. The calibration signal source 122 provides the calibration signal which has known frequency and amplitude characteristics. The calibration signal may have a simple waveshape, such as a square wave, which has significant harmonic content at the odd harmonics of its fundamental frequency. Alternatively, more complex waveforms for the calibration signal may be chosen to obtain desired signal energy levels over selected frequency ranges, including a square wave with a variable duty cycle, a swept-frequency sine wave, and "white noise", which is random or pseudo-random noise that provides uniform signal energy across a broad frequency spectrum. Obtaining desired signal energy levels over selected frequency ranges is desirable in order to maintain the accuracy of the compensation over the desired frequency range performed by the adaptive digital filter 117 which uses the set of digital filter constants derived from measurements of the calibration signal.

The digital filter values are calculated by coupling the calibration signal source to the input of the front-end circuit, measuring the calibration signal source to obtain a set of calibration measurement values responsive to the calibration signal, and comparing the set of calibration measurement values against an ideal set of calibration measurement values to obtain an error vector. Digital filter values are chosen which minimize the error vector, thereby minimizing the frequency response errors introduced by the front-end circuit.

During the measurement phase, the adaptive digital filter 117 operates on the measurement values to obtain normalized measurement values based on a set of digital filter values or variables which were calculated during the calibration phase as explained more fully below. The normalized measurement values are then coupled to a microprocessor 118 which stores and further processes the normalized measurement values which are then coupled to the display 120 for visual display.

By reducing the frequency response errors introduced by the front-end circuit 114 according to the present invention, the requirements on the front-end circuit 114 are substantially reduced in several ways. First, the designed frequency response of the front-end circuit 114 need not be as close to the ideal frequency response 50 shown in FIG. 2A as previously required, thereby reducing component count and circuit complexity. Second, the manufacturing tolerances between units is substantially relaxed or eliminated, eliminating the need for manually adjusting the front-end circuit 114 and reducing the tolerances required of the component parts comprising the front-end circuit 114, thereby reducing manufacturing cost.

Figure 4:
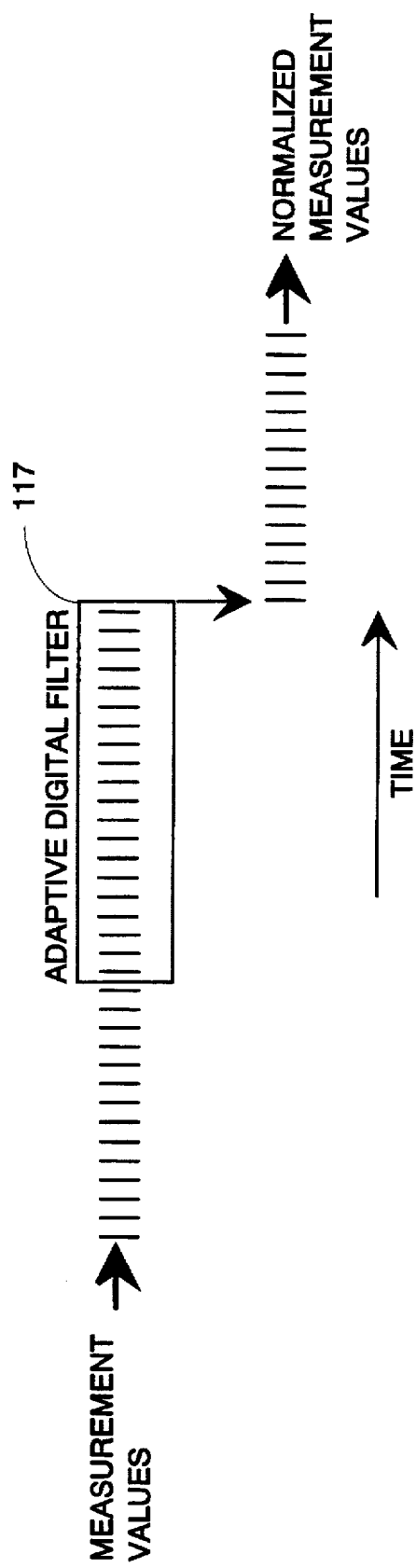
FIG. 4 is a timing diagram (not to scale) of the measurement values arriving at a sample rate and operated upon by the adaptive digital filter to obtain normalized measurement values in the electronic instrument of FIG. 3.

FIG. 4 is a timing diagram (not to scale) of the measurement values arriving in a continuous stream at the sample rate and operated upon with by adaptive digital filter 117 to obtain normalized measurement values. The over-sampling ADC 116 continuously samples the input signal at the sample rate and provides a stream of measurement values. The frequency information contained in the input signal is captured in the form of a time record formed from the stream of measurement values. The adaptive digital filter 117 operates on a multiple number of measurement values from the stream simultaneously in a manner commonly known as convolution. Each measurement value of the stream of measurement values is multiplied against a set of digital filter values and added to other measurement values in the stream to produce a second stream of normalized measurement values. The number of measurement values operated on simultaneously by the adaptive digital filter 117 is determined by its length or number of taps contained. The length of the adaptive digital filter 117 in turn is determined by considerations of the level of accuracy required of the normalized measurement values and the computational complexity of solving for a larger number of digital filter values.

The adaptive digital filter 117 may consist of any of a number of different types, including finite impulse response (FIR) and infinite impulse response (IIR) filters which are known in the art for use in adaptive filtering applications. Although each type of adaptive digital filter may differ in its precise method of multiplying and combining measurement values, each shares the common feature of convolving the measurement values in the time domain using known filter algorithms and inexpensive electronic components.

Figure 5:
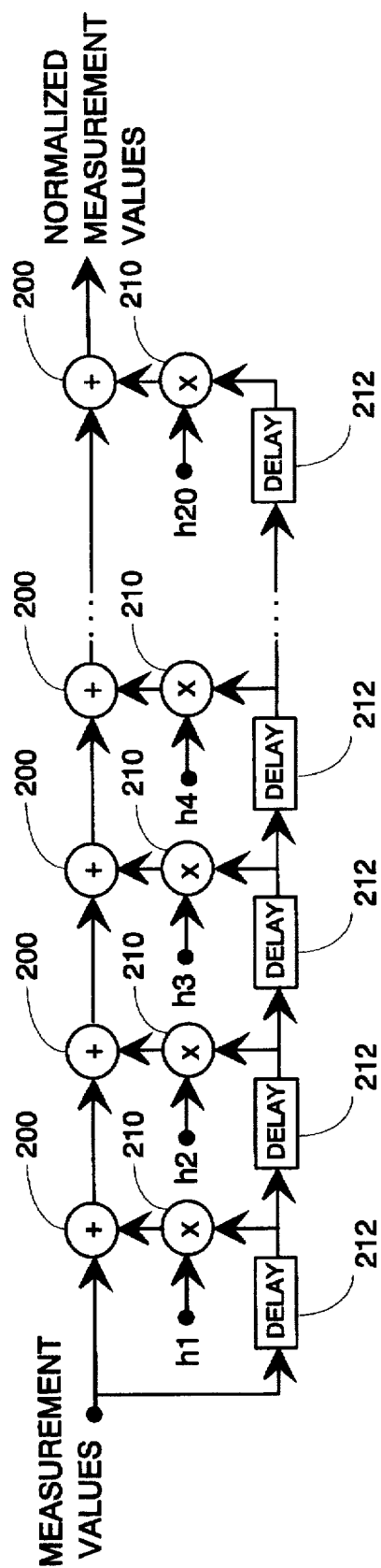
FIG. 5 is a simplified block diagram of a finite impulse response (FIR) filter as employed in the adaptive digital filter in the electronic instrument of FIG. 3 according to the present invention.

FIG. 5 illustrates one embodiment of the adaptive digital filter 117 according to the present invention as an FIR filter. The FIR filter structure may be implemented either as a software algorithm which manipulates data stored in memory locations or as a hardware device such as a standard cell array of a programmable digital logic circuit that is adapted for FIR filter operation.

As shown in FIG. 5, the stream of measurement values enters the FIR filter at the node labeled MEASUREMENT VALUES. Each section of the FIR filter, comprising a summing element 200, a multiplying element 210 and a delay element 212, may be coupled to further sections down the chain to generate the stream of normalized measurement values. The delay element 212 imposes a delay of one sample period corresponding to the sample rate of the over-sampling ADC 116. Each multiplying element 210 receives a corresponding digital filter value. The adaptive digital filter 117 thus contains the most recent measurement values in the stream to produce a corresponding stream of normalized measurement values.

During the measurement phase, each measurement value contained in each section is multiplied by a corresponding digital filter value of a set of digital filter values and the product is then summed to the products produced by all the other sections in a process of convolution. Convolution is commonly understood to be the time domain equivalent of multiplication in the frequency domain.

Because the input signal is converted to measurement values which are in the time domain, conversion to the frequency domain using a Fourier transform for multiplication followed by conversion back to the time domain would be necessary, which is computationally intensive. Adaptive digital filters typically use time domain convolution because it is substantially simpler to implement, requiring only that an optimal set of digital filter values be calculated once when measuring the calibration signal to accomplish the normalization function.

During the calibration phase, a calibration signal having known amplitude and frequency characteristics is substituted for the input signal. An expected set of values representing the calibration signal has already been stored. An error signal is calculated which represents the difference between the estimate signal received from the oversampling ADC 116 while measuring the calibration signal and the expected set of values. An interactive mathematical method which operates on the set of digital filter values is then employed to minimize the overall error level contained in the error signal. In this way, the values contained in the estimate signal most closely match the stored expected values and the error contribution to the measurement values from the front-end circuit 114 is thereby minimized.

The mathematical method for deriving the set of digital filter values may be any of a number of methods known in the art relating to adaptive digital filters. With the adaptive digital filter 117 implemented in the form of an FIR filter in the preferred embodiment, the digital filter values are calculated according to the least mean squares (LMS) method in the preferred embodiment. The LMS method requires multiple iterations in order for the set of digital filter values to converge on an optimal solution that minimizes the error signal. Increasing the number of digital filter values in the set, along with the number of corresponding taps in the FIR filter, increases the accuracy of the normalization process within the FIR filter. However, employing increasingly larger sets of digital filter values requires substantially longer computation times to calculate the set of digital filter values during the calibration phase.

Figure 6:
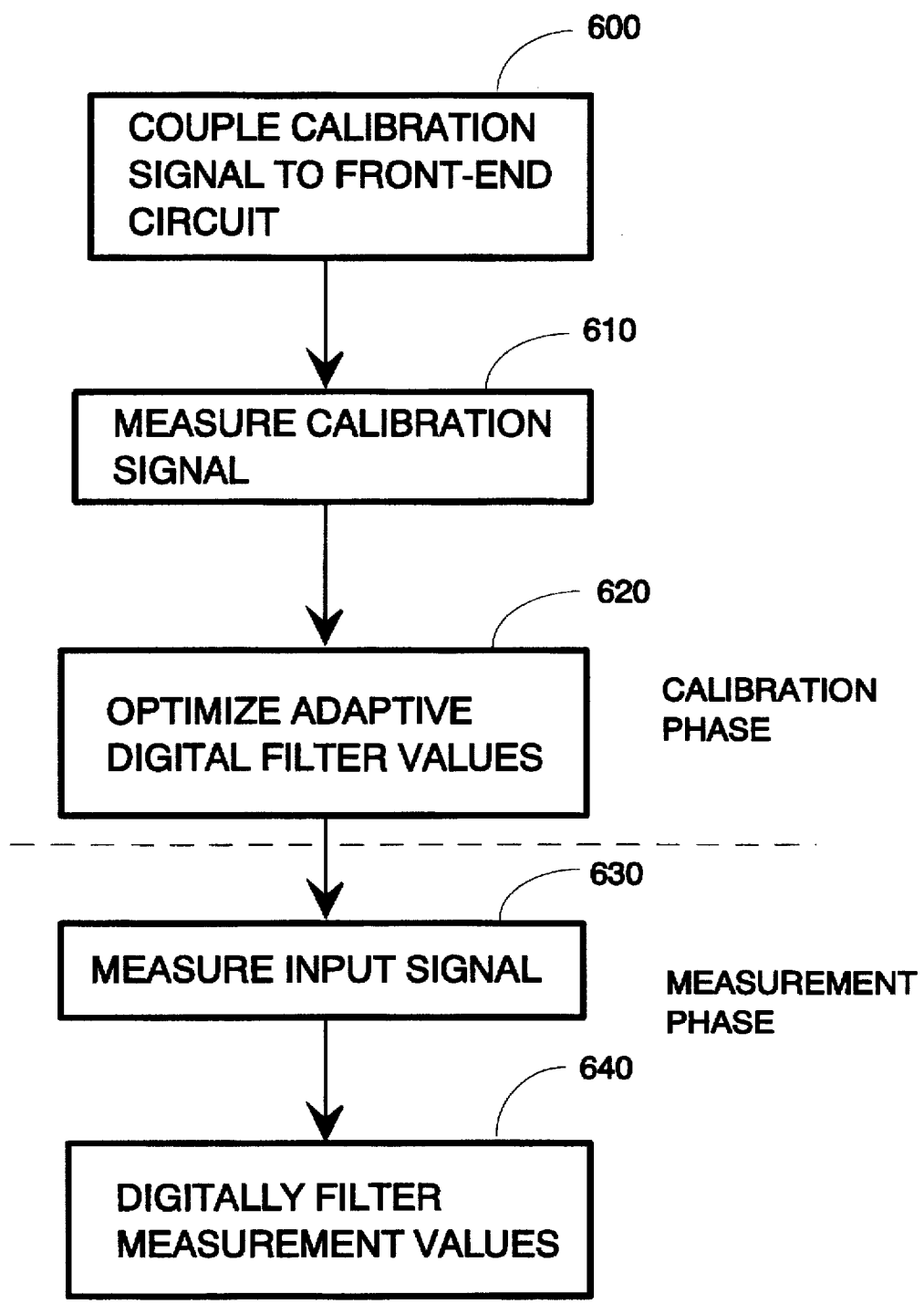
FIG. 6 is a flow diagram of a process of obtaining improved measurement accuracy using the adaptive digital filter of FIG. 5 according to the present invention.

FIG. 6 is a flow diagram of the process of obtaining improved measurement accuracy using the adaptive digital filter according to the present invention. In process 600 labeled "COUPLE CALIBRATION SIGNAL TO FRONT-END CIRCUIT", the calibration signal source 122 (shown in FIG. 3) is coupled to the input of the front-end circuit 114 in place of the input signal. The calibration signal has a known amplitude and frequency components across the frequency range of interest which may then be measured.

In process 610 labeled "MEASURE CALIBRATION SIGNAL", the calibration signal is coupled to the over-sampling ADC 116 and a stream of calibration measurement values are produced which constitutes an estimate signal.

In process 620 labeled "OPTIMIZE ADAPTIVE DIGITAL FILTER VALUES" the adaptive digital filter values are optimized using an algorithm. Because of the wide variety of possible implementations of digital filters, there is a corresponding variety of algorithms to calculate the digital filter values necessary to adapt the digital filter to the specific application. In the preferred embodiment, the LMS algorithm is employed which is commonly associated with FIR filters. The difference between the calibration signal and the estimated signal is an error signal. According to the LMS algorithm, initial values which are predetermined to be reasonably close to the set of optimal digital filter values are provided to the LMS algorithm in order to reduce the time required for the algorithm converge on the desired digital filter values. The set of digital filter values is optimized when the overall error signal is minimized.

The processes 600, 610, and 620 together comprise the calibration phase of the operation of the electronic instrument 110. The calibration phase may be performed as frequently as necessary to compensate for short term variations in the frequency response of the front-end circuit 114.

In process 630 labeled "MEASURE INPUT SIGNAL", the calibration signal source 122 is de-coupled from the input of the front-end circuit 114 and the input signal re-applied under normal measurement conditions. A stream of measurement values is then produced according to the sample rate of the over-sampling ADC 116.

In process 640 labeled "DIGITALLY FILTER MEASUREMENT VALUES", the set of optimal digital filter values is applied to the adaptive digital filter 117. The adaptive digital filter 117 then operates on the stream of measurement values as a convolution to provide the stream of normalized measurement values according to the optimal digital filter values which remove the frequency distortion effects of the front-end circuit 114 to achieve a desired level of measurement accuracy over the frequency range of interest.

Processes 630 and 640 together comprise the measurement phase of operation of the electronic instrument 110. The measurement phase represents the normal operating state of the electronic instrument 110 in which the input signal must be measured and displayed within a specified accuracy level.

It will be obvious to those having ordinary skill in the art that many changes may be made in the details of the above described preferred embodiments of the invention without departing from the spirit of the invention in its broader aspects. A variety of digital filter types may be employed with the common feature that the digital filtering operation is done by convolution in the time domain rather than multiplication in the frequency domain to normalize the frequency response of the front-end circuit. Different types of calibration signals may be employed to provide a known amount of signal voltage at the frequencies of interest within the measurement frequency range. Therefore, the scope of the present invention should be determined by the following claims.

What we claim as our invention is:

1. A method for improving measurement accuracy in an electronic instrument, comprising:

(a) coupling a calibration signal having known amplitude and frequency characteristics to a front-end circuit during a calibration phase;

(b) measuring said calibration signal with an over-sampling analog to digital converter which receives said calibration signal through said front-end circuit and generates a stream of calibration measurement values which forms an estimate signal during a calibration phase;

(c) optimizing a set of digital filter values to minimize the overall difference between said calibration signal and said estimate signal;

(d) replacing said calibration signal with an input signal to be measured during a measurement phase;

(e) measuring said input signal with said over-sampling analog to digital converter which receives said input signal through front-end circuit and generates a stream of measurement values; and (f) digitally filtering said measurement values with an adaptive digital filter using said digital filter values to obtain normalized measurement values.

2. A method for improving measurement accuracy in an electronic instrument according to claim 1 wherein said adaptive digital filter comprises a finite impulse response filter.

3. A method for improving measurement accuracy in an electronic instrument according to claim 2 further comprising optimizing said set of digital filter values according to a least-means squares mathematical algorithm.

4. A method for improving measurement accuracy in an electronic instrument according to claim 2 wherein said finite impulse response filter operates on said measurement values using convolution in the time domain.

5. A method for improving measurement accuracy in an electronic instrument according to claim 1 wherein said calibration signal comprises a square wave.

6. A method for improving measurement accuracy in an electronic instrument according to claim 5 wherein said square wave has a variable duty cycle.

7. A method for improving measurement accuracy in an electronic instrument according to claim 1 wherein said calibration signal comprises a swept-frequency sine wave.

8. A method for improving measurement accuracy in an electronic instrument according to claim 1 wherein said calibration signal comprises random noise.

9. A method for improving measurement accuracy in an electronic instrument, comprising:

(a) coupling a calibration signal comprising a square wave having known amplitude and frequency characteristics to a front-end circuit during a calibration phase;

(b) measuring said calibration signal with an over-sampling analog to digital converter which receives said calibration signal through said front-end circuit and generates a stream of calibration measurement values which forms an estimate signal;

(c) optimizing a set of digital filter values according to a least-means squares mathematical algorithm to minimize the overall difference between said calibration signal and said estimate signal;

(d) replacing said calibration signal with an input signal to be measured during a measurement phase;

(e) measuring said input signal with said over-sampling analog to digital converter which receives said input signal through front-end circuit and generates a stream of measurement values; and (f) digitally filtering said measurement values with a finite impulse response filter which uses said set of digital filter values to obtain normalized measurement values.

10. A method for improving measurement accuracy in an electronic instrument according to claim 9 wherein said finite impulse response filter operates on said measurement values using convolution in the time domain.

11. A method for improving measurement accuracy in an electronic instrument according to claim 9 wherein said square wave has a variable duty cycle.

12. An electronic instrument with enhanced measurement accuracy, comprising:

(a) a front-end circuit having an input for coupling to an input signal, said front-end circuit having a frequency response;

(b) an over-sampling analog-to-digital converter coupled to said front-end circuit to receive said input signal and produce a measured signal comprising a stream of measurement values at a sample rate at least twice the highest frequency of said input signal;

(c) a calibration signal source for coupling a calibration signal having known amplitude and frequency characteristics to said input of said front-end circuit during a calibration phase wherein a set of digital filter values are optimized so as to minimize the differences between said measured signal and said calibration signal; and (d) an adaptive digital filter coupled to said over-sampling analog-to-digital converter to receive said measurement values, said adaptive digital filter operating on said stream of measurement values according to said set of digital filter values during a measurement phase to provide normalized measurement values with the effects of said frequency response substantially reduced.

13. An electronic instrument with enhanced measurement accuracy according to claim 12 wherein said adaptive digital filter comprises a finite impulse response filter.

14. An electronic instrument with enhanced measurement accuracy according to claim 13 wherein said set of digital filter values is optimized according to a least-means squares mathematical algorithm.

15. An electronic instrument with enhanced measurement accuracy according to claim 13 wherein said finite impulse response filter operates on said measurement values using convolution in the time domain.

16. An electronic instrument with enhanced measurement accuracy according to claim 12 wherein said calibration signal comprises a square wave.

17. An electronic instrument with enhanced measurement accuracy according to claim 16 wherein said square wave has a variable duty cycle.

18. An electronic instrument with enhanced measurement accuracy according to claim 12 wherein said calibration signal comprises a swept-frequency sine wave.

19. An electronic instrument with enhanced measurement accuracy according to claim 12 wherein said calibration signal comprises random noise.

* * * * *